(12) United States Patent
Deas et al.

(10) Patent No.: US 10,244,331 B1
(45) Date of Patent: Mar. 26, 2019

(54) MEMS DEVICES

(71) Applicant: Cirrus Logic International Semiconductor Ltd., Edinburgh (GB)

(72) Inventors: James Thomas Deas, Edinburgh (GB); John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/953,094

(22) Filed: Apr. 13, 2018

(30) Foreign Application Priority Data

Apr. 12, 2018 (WO) ................ PCT/GB2018/050976

(51) Int. Cl.
*H04R 19/04* (2006.01)
*B81B 7/00* (2006.01)
*H04R 19/00* (2006.01)

(52) U.S. Cl.
CPC ............ *H04R 19/04* (2013.01); *B81B 7/008* (2013.01); *B81B 7/0061* (2013.01); *B81B 7/0087* (2013.01); *H04R 19/005* (2013.01); *B81B 2201/0257* (2013.01); *B81B 2201/0264* (2013.01); *B81B 2207/03* (2013.01); *H04R 2201/003* (2013.01)

(58) Field of Classification Search
CPC .... H04R 19/005; H04R 19/04; H04R 31/006; H04R 7/10; H04R 7/18; H04R 7/06; H04R 7/122; H04R 2201/003; B81B 7/0061; B81B 7/008; B81B 7/0087; B81B 2201/0257; B81B 2201/0264; B81B 2207/03
See application file for complete search history.

(56) References Cited

U.S. PATENT DOCUMENTS

| 8,942,394 B2 * | 1/2015 | Conti | H04R 7/24 381/174 |
|---|---|---|---|
| 2009/0278217 A1 * | 11/2009 | Laming | B81C 1/00158 257/419 |
| 2010/0232623 A1 | 9/2010 | Martin et al. | |
| 2010/0329487 A1 * | 12/2010 | David | H03F 3/187 381/174 |

(Continued)

OTHER PUBLICATIONS

International Search Report and Written Opinion of the International Searching Authority, International Application No. PCT/GB2018/050976, dated Dec. 7, 2018.

*Primary Examiner* — Mohammad K Islam
(74) *Attorney, Agent, or Firm* — Jackson Walker L.L.P.

(57) ABSTRACT

The present disclosure relates to a micro electro-mechanical system (MEMS) device comprising a fixed electrode, a moveable electrode that is moveable with respect to the fixed electrode and an output terminal for outputting a transducer output signal indicative of a capacitance between the fixed electrode and the moveable electrode. A package is provided which houses the fixed electrode and the moveable electrode, the package defining a first volume on a first side of the moveable electrode. The moveable electrode is moveable within the first volume in response to sound or pressure waves incident on the moveable electrode. A power dissipation element is disposed within the package. The power dissipation element is configured to receive a generated stimulus signal and to dissipate heat into the first volume so as to modulate the pressure of air within the first volume in accordance with the received generated stimulus signal.

20 Claims, 14 Drawing Sheets

(56) References Cited

U.S. PATENT DOCUMENTS

| | | | |
|---|---|---|---|
| 2011/0111545 A1* | 5/2011 | El-Gamal | B81C 1/00063 438/50 |
| 2011/0311080 A1* | 12/2011 | Jaar | H04R 3/00 381/174 |
| 2013/0277776 A1 | 10/2013 | Herzum et al. | |
| 2014/0084396 A1* | 3/2014 | Jenkins | B81B 3/0021 257/419 |
| 2014/0270273 A1* | 9/2014 | Muza | H04R 19/005 381/174 |
| 2015/0256915 A1* | 9/2015 | Hoekstra | H04R 19/005 257/416 |
| 2015/0256924 A1* | 9/2015 | Hoekstra | H04R 19/005 257/416 |
| 2015/0318829 A1* | 11/2015 | Astgimath | H03F 3/505 381/120 |
| 2016/0091378 A1* | 3/2016 | Tsai | H04R 19/005 73/728 |
| 2017/0121173 A1* | 5/2017 | Hoekstra | B81B 7/0029 |
| 2017/0217762 A1* | 8/2017 | Hoekstra | B81B 7/0061 |
| 2017/0288125 A1* | 10/2017 | Glacer | H01L 41/0805 |
| 2018/0152788 A1* | 5/2018 | Perletti | B81B 3/0054 |

\* cited by examiner

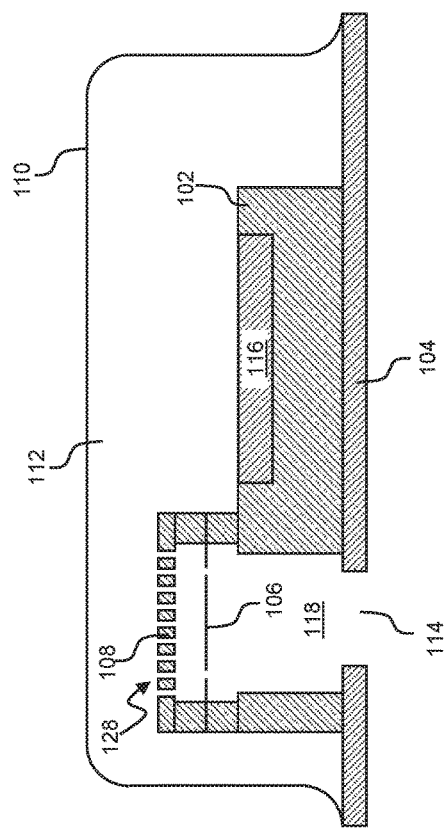

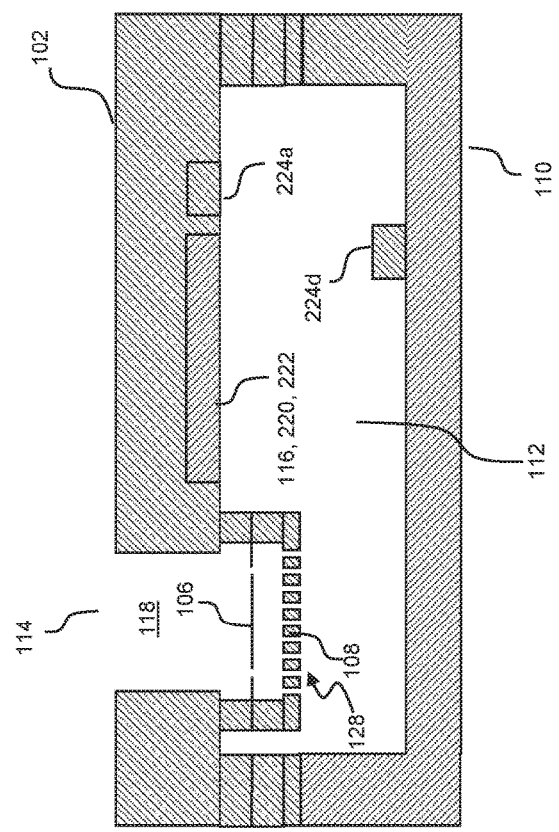

MEMS DEVICES

FIELD OF THE INVENTION

The present disclosure relates to the field of MEMS (Micro Electro-Mechanical Systems) devices. In particular, the present disclosure relates to a system and method for compensating for sensitivity drift in a MEMS device such as a MEMS microphone.

BACKGROUND

Micro-electro-mechanical system (MEMS) transducers such as MEMS microphones are increasingly finding application in portable electronic devices such as mobile telephones, laptop and tablet computers, audio and video players, personal digital assistants (PDAs) and wearable devices such as smart watches, at least in part due to the small size of such transducers.

Transducers such as capacitive microphones or pressure sensor devices formed using MEMS fabrication processes typically comprise an electrode that is moveable with respect to a fixed electrode in response to incident acoustic or pressure waves, such that the fixed electrode and the moveable electrode together form a variable capacitance. The moveable electrode may, for example, be supported by a flexible membrane. In use a first one of the electrodes may be biased by a relatively high, stable bias voltage $V_{BIAS}$, which may be of the order of 12V, whilst the other electrode is biased to another fixed voltage $V_{REF}$, typically ground, via a very high impedance, for example, of the order of 10 GΩ. Acoustic or pressure waves incident on the transducer will cause displacement of the moveable electrode with respect to the fixed electrode, thus changing the spacing between these electrodes and hence the inter-electrode capacitance. As the second electrode of the transducer is biased via a very high impedance, these changes in capacitance cause an output signal voltage to appear at an output terminal of the transducer. The output signal voltage for normal sound pressure levels is of the order of millivolts and the capacitance of the MEMS transducer is of the order of a picofarad, so the transducer is typically connected to a low noise amplifier arrangement to buffer and amplify the signal.

To provide protection the MEMS transducer is typically housed within a package. The package effectively encloses the MEMS transducer and can provide environmental protection and may also provide shielding from electromagnetic interference (EMI) or the like. The package also provides at least one external connection for outputting an output signal to downstream circuitry. For microphones, pressure sensors and the like the package typically has a sound port to allow transmission of sound waves to or from the transducer within the package, and the transducer may be configured so that the flexible electrode is located between first and second volumes, i.e. spaces or cavities that may be filled with air, and which are sized sufficiently that the transducer provides the desired acoustic response. The first volume, sometimes referred to as a back volume, on a first side of the flexible electrode, allows the flexible electrode to move freely in response to incident sound or pressure waves, and this back volume may be substantially sealed. The sound port acoustically couples to a second volume on a second side of the flexible electrode, which may sometimes be referred to as a front volume. It will be appreciated by one skilled in the art that for MEMS microphones and the like the first and second volumes may be connected by one or more flow paths, such as small holes in the flexible electrode that are configured so as to present a relatively high acoustic impedance at the desired acoustic frequencies but which allow for low-frequency pressure equalisation between the two volumes to account for pressure differentials due to temperature changes or the like.

The package may also contain support circuitry on the same or a separate semiconductor die as the moveable electrode. A function of the support circuitry is to measure the output signal voltage of the transducer. The support circuitry may also provide one or more audio processing functions such as filtering, equalisation and the like. The support circuitry may also provide bias to the electrodes, analogue to digital conversion, analogue or digital signal conditioning, an analogue or digital output interface, and/or other functions.

It has been found that the sensitivity of MEMS transducers such as capacitive microphones (which may be defined as the ratio of the output signal voltage of the MEMS transducer to the input acoustic pressure) can change over time. This is known as sensitivity drift. In some cases the sensitivity of the transducer increases over time, whilst in other cases the sensitivity of the transducer may decrease over time. As will be appreciated, sensitivity drift in a MEMS transducer is undesirable, as it can cause inconsistent performance of a device in which the MEMS transducer is incorporated. Thus, a need exists for a mechanism for detecting sensitivity drift in a MEMS transducer such as a MEMS capacitive microphone and compensating for any detected drift.

SUMMARY

According to a first aspect, the invention provides a micro electro-mechanical system (MEMS) device comprising: a fixed electrode; a moveable electrode that is moveable with respect to the fixed electrode; an output terminal for outputting a transducer output signal indicative of a capacitance between the fixed electrode and the moveable electrode; a package housing the fixed electrode and the moveable electrode, wherein the package defines a first volume on a first side of the moveable electrode, and wherein the moveable electrode is moveable within the first volume in response to sound or pressure waves incident on the moveable electrode; and a power dissipation element disposed within the package, wherein the power dissipation element is configured to receive a generated stimulus signal and to dissipate heat into the first volume so as to modulate the pressure of air within the first volume in accordance with the received predetermined stimulus signal.

The MEMS device of the first aspect advantageously allows a deliberate thermal modulation of the air pressure within the first volume based on the generated stimulus signal so as to impart a corresponding stimulus to the moveable electrode, which in turn generates a detectable signal in the output of the MEMS transducer based on the generated stimulus signal. This detectable signal can advantageously be used to detect and compensate for drift in the MEMS transducer.

The MEMS device may further comprise signal generator circuitry configured to output the generated stimulus signal to the power dissipation element.

For example, the signal generator circuitry may be configured to generate the generated stimulus signal based at least in part on stored digital control data.

The MEMS device may further comprise: support circuitry configured to provide a bias voltage to the moveable membrane or to process the transducer output signal.

The MEMS device may further comprise: detection circuitry configured to detect a stimulus signal in the transducer output signal that corresponds to the generated stimulus signal; amplitude estimator circuitry configured to estimate an amplitude of the detected stimulus signal; and gain correction circuitry configured to apply a gain correction to the support circuitry based on the estimated amplitude.

The support circuitry may comprise at least one of: reference generator circuitry configured to generate a reference voltage for a charge pump that is configured to provide the bias voltage to the moveable membrane; amplifier circuitry configured to amplify the transducer output signal; and signal processing circuitry, and the gain correction circuitry may be configured to apply a gain correction to at least one of the reference generator circuitry, amplifier circuitry and signal processing circuitry.

The signal generator circuitry may comprise a system for adjusting the generated stimulus signal in accordance with changes to a supply voltage of the MEMS device.

For example, the signal generator circuitry may be configured to monitor the supply voltage and to modulate the generated stimulus signal in inverse proportion to a magnitude of the supply voltage.

Advantageously, the generated stimulus signal may comprise a complex signal.

For example, the generated stimulus signal may comprise a direct-sequence spread-spectrum code.

A frequency of the generated stimulus signal is preferably outside a frequency band of interest of the MEMS device.

An amplitude of the generated stimulus signal is preferably lower than a noise floor of the MEMS device.

The power dissipation element may comprise a passive device or active circuitry.

The moveable electrode may be integrated on a first semiconductor die.

The support circuitry may be integrated on a second semiconductor die.

The power dissipation element may be integrated on the first semiconductor die or the second semiconductor die.

Alternatively, the power dissipation element may be provided within the package but not integrated on the first or second semiconductor die.

At least part of the support circuitry may be covered with a thermal barrier, and the power dissipation element may be physically spaced from the support circuitry and the thermal barrier.

According to a second aspect of the invention there is provided a system for compensating for sensitivity drift in a transducer of a MEMS device, wherein the transducer comprises: a fixed electrode; a moveable electrode that is moveable with respect to the fixed electrode; and an output terminal for outputting a transducer output signal indicative of a capacitance between the fixed electrode and the moveable electrode, wherein the MEMS device comprises: a package housing the fixed electrode and the moveable electrode, wherein the package defines a first volume on a first side of the moveable electrode, and wherein the moveable electrode is moveable within the first volume in response to sound or pressure waves incident on the moveable electrode, wherein the system comprises: a power dissipation element; support circuitry configured to provide a bias voltage to the moveable membrane or to process the transducer output signal; signal generator circuitry configured to output a stimulus signal to the power dissipation element to cause the power dissipation element to dissipate heat into the first volume so as to modulate the pressure of air within the first volume in accordance with the received generated stimulus signal so as to generate a corresponding stimulus signal in the transducer output signal; detector circuitry configured to detect the corresponding stimulus signal in the transducer output signal; amplitude estimator circuitry configured to estimate an amplitude of the detected stimulus signal; and gain correction circuitry configured to apply a gain correction to the support circuitry based on the estimated amplitude in order to compensate for sensitivity drift in the transducer.

The support circuitry may comprise at least one of: reference generator circuitry configured to generate a reference voltage for a charge pump that is configured to provide a bias voltage for the moveable membrane; amplifier circuitry configured to amplify the transducer output signal; and signal processing circuitry, and the gain correction circuitry may be configured to apply a gain correction to at least one of the reference generator circuitry, amplifier circuitry and signal processing circuitry.

The signal generator circuitry may comprise a system for adjusting the generated stimulus signal in accordance with changes to a supply voltage of the MEMS device.

For example, the signal generator circuitry may be configured to monitor the supply voltage and to modulate the generated stimulus signal in inverse proportion to a magnitude of the supply voltage.

Advantageously, the generated stimulus signal may comprise a complex signal.

For example, the generated stimulus signal may comprises a direct-sequence spread-spectrum code.

A frequency of the generated stimulus signal is preferably outside a frequency band of interest of the MEMS device.

The frequency band of interest may be, for example, a frequency band of an output signal of the MEMS device that is anticipated to be used in downstream processing, within which characteristics of the MEMS transducer such as sensitivity, noise and spurious signal level are defined, for example in a specification of the device.

An amplitude of the generated stimulus signal is preferably lower than a noise floor of the MEMS device.

The power dissipation element may comprise a passive device or active circuitry.

The moveable electrode may be integrated on a first semiconductor die of the MEMS device.

The support circuitry may be integrated on a second semiconductor die of the MEMS device.

The power dissipation element may be integrated on the first semiconductor die or the second semiconductor die.

Alternatively, the power dissipation element may be provided within the package but not integrated on the first or second semiconductor die.

At least part of the support circuitry may be covered with a thermal barrier, and the power dissipation element may be physically spaced from the support circuitry and the thermal barrier.

According to a third aspect of the invention there is provided a method for compensating for a change in the sensitivity of a transducer of a MEMS device, wherein the transducer comprises: a fixed electrode; a moveable electrode that is moveable with respect to the fixed electrode; and an output terminal for outputting a transducer output signal indicative of a capacitance between the fixed electrode and the moveable electrode, wherein the MEMS device comprises: a package housing the fixed electrode and the moveable electrode, wherein the package defines a first volume on a first side of the moveable electrode, and wherein the moveable electrode is moveable within the first volume in response to sound or pressure waves incident on the moveable electrode; and support circuitry configured to provide a bias voltage to the moveable membrane or to process the transducer output signal, wherein the method comprises: modulating the pressure of air in the first volume in accordance with a generated stimulus signal to generate a corresponding output stimulus signal in the transducer output signal; detecting the output stimulus signal; estimating an amplitude of the detected stimulus signal; and applying a gain correction to the support circuitry based on the estimated amplitude in order to compensate for sensitivity drift in the transducer.

The support circuitry may comprise at least one of: reference generator circuitry configured to generate a reference voltage for a charge pump that is configured to provide a bias voltage for the moveable membrane; amplifier circuitry configured to amplify the transducer output signal; and signal processing circuitry, and applying a gain correction to the support circuitry may comprise applying a gain correction to at least one of the reference generator circuitry, amplifier circuitry and signal processing circuitry.

Detecting the output stimulus signal may comprise performing a correlation function on the transducer output signal.

According to a fourth aspect of the invention there is provided a method for calibrating the system of the second aspect, the method comprising: applying a generated stimulus signal to the power dissipation element to generate a corresponding output stimulus signal in the transducer output signal; detecting the output stimulus signal; estimating an amplitude of the detected output stimulus signal; comparing the estimated amplitude of the detected stimulus signal to a reference value; and applying a gain correction to the support circuitry based on the estimated amplitude in order to compensate for sensitivity drift in the transducer.

The reference value is preferably stored in a memory of the MEMS device.

The reference value may be based on an average amplitude of the generated stimulus signal that was determined prior to performing the method.

The reference value may be modified according to a supply voltage of the power dissipation element.

The circuitry may comprise at least one of: reference generator circuitry configured to generate a reference voltage for a charge pump that is configured to provide a bias voltage for the moveable membrane; amplifier circuitry configured to amplify the transducer output signal; and signal processing circuitry, and applying a gain correction to the support circuitry comprises applying a gain correction to at least one of the reference generator circuitry, amplifier circuitry and digital signal processing circuitry.

According to a fifth aspect of the invention there is provided a MEMS transducer comprising: a semiconductor die on which are formed: a fixed electrode; a moveable electrode that is moveable with respect to the fixed electrode; and a power dissipation element, wherein the power dissipation element is configured to receive a predetermined stimulus signal and to dissipate power in accordance with the received predetermined stimulus signal.

According to a sixth aspect of the invention there is provided a MEMS device comprising: a MEMS transducer in acoustic communication with a volume; a power dissipation element in thermal communication with the volume; and circuitry for applying a generated stimulus waveform to the power dissipation element, wherein the power dissipation element provides a thermal stimulus to the volume in accordance with the applied generated stimulus waveform resulting in an acoustic stimulus to the transducer.

According to a seventh aspect of the invention there is provided a micro electro-mechanical system (MEMS) device for providing an electrical output signal in response to an input acoustic signal, the device comprising: a capacitive MEMS transducer in acoustic communication with a volume a power dissipation element in thermal communication with the volume; a stimulus signal generator for driving the power dissipation element with a generated stimulus signal; calibration control circuitry for comparing a level of a component of an electrical signal derived from the transducer and related to the stimulus signal to a stored reference level; and gain control circuitry configured to adjust the amplitude of the electrical output signal in response to the comparison.

According to an eighth aspect of the invention there is provided a MEMS package comprising a MEMS capacitive transducer; a signal generator for generating a control signal; and a controllable power dissipation element for dissipating power in response to the control signal for acoustically stimulating the MEMS capacitive transducer.

According to a ninth aspect of the invention there is provided an electronic apparatus comprising a MEMS device according to the first, sixth or seventh aspect or a MEMS package according to the eights aspect, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

According to a tenth aspect of the invention there is provided electronic apparatus comprising a system according to the second aspect, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

BRIEF DESCRIPTION OF THE DRAWINGS

Embodiments of the invention will now be described, strictly by way of example only, with reference to the accompanying drawings, of which:

FIG. 1 is a schematic cross-sectional representation of a MEMS device;

FIG. 2b is a schematic functional block diagram illustrating a system implemented by the MEMS device of FIG. 2a;

FIG. 3a is a schematic functional block diagram illustrating functional elements that may be present in support circuitry of the MEMS device of FIG. 2a;

FIG. 3b is a schematic functional block diagram illustrating functional elements that may be present in alternative support circuitry of the MEMS device of FIG. 2a;

FIG. 5d is a schematic cross-sectional representation of a further alternative MEMS device;

DETAILED DESCRIPTION

Figure 2A:
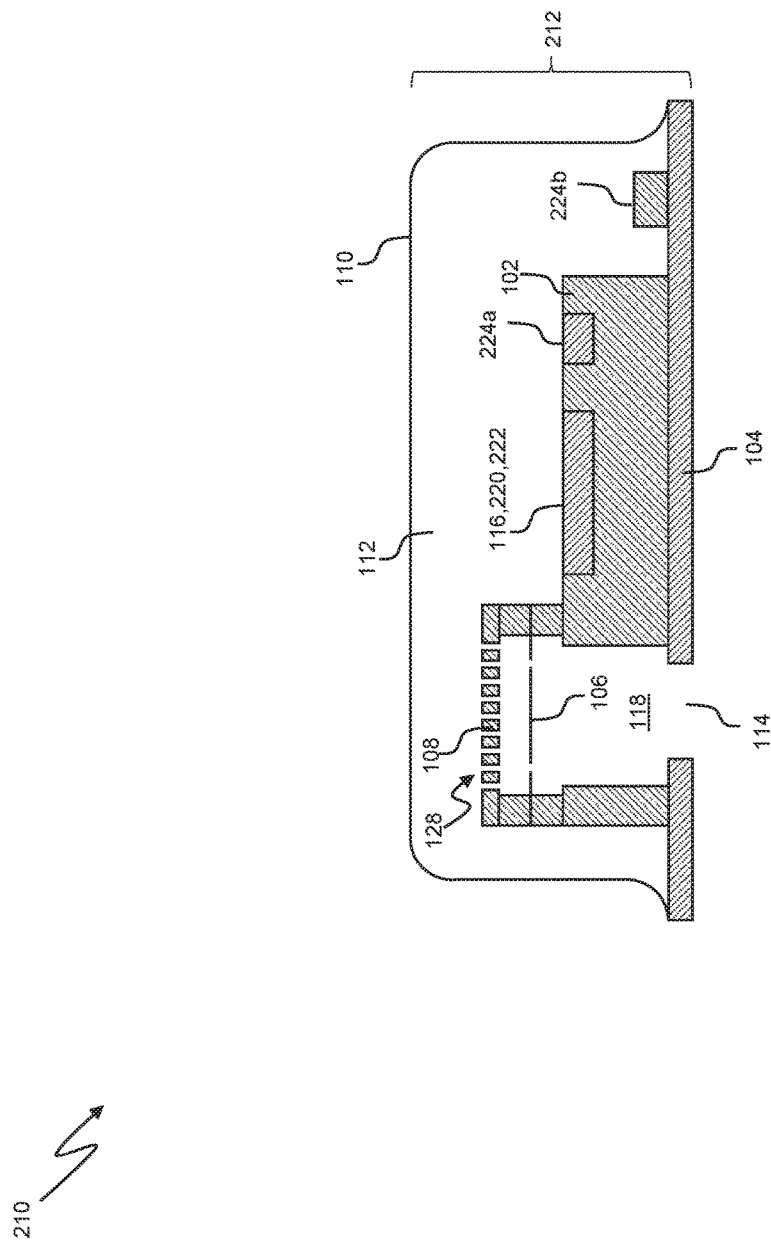
FIG. 2a is a schematic cross-sectional representation of an alternative MEMS device.

Referring first to FIG. 1, a packaged MEMS device, which in the illustrated example is a MEMS capacitive microphone device, is shown schematically in cross-section at 100.

The device 100 includes a monolithic semiconductor die 102 mounted on a package substrate 104. The semiconductor die 102 includes both support circuitry 116 and a co-integrated MEMS transducer 128 including a moveable membrane 106 and a fixed back plate 108. The moveable membrane 106 and the fixed back plate 108 are positioned adjacent to and spaced apart from each other, and each includes an electrode (not shown), or is conductive and thus forms an electrode, such that the moveable membrane 106 and the fixed back plate 108 form the plates of a capacitor. Therefore, in this example, the semiconductor die 102 contains support circuitry 116 and a MEMS transducer structure 128. In other examples the MEMS transducer elements 106, 108 may be implemented on a separate monolithic semiconductor die to that of the support circuitry 116.

The support circuitry 116 and MEMS transducer 128 may be packaged in a number of ways. For example, as shown in FIG. 1, the semiconductor die 102 comprising the MEMS transducer 128 is mounted on the package substrate 104 and covered by a lid 110 to define a chamber comprising a first volume 112 on a first side of the moveable membrane 106 (which in the illustrated example is an upper or back side of the moveable membrane 106). This first volume 112 may serve, for example, as the back volume of a MEMS microphone.

In examples where the MEMS transducer is implemented as a separate monolithic semiconductor die, the first monolithic semiconductor die 102 and a second monolithic semiconductor die comprising some or all of the support circuitry 116 may be attached separately to a common package substrate and covered by a common lid to define a common volume. However, other packaging types may instead be used. For instance, in wafer-level chip-scale packaging (WLCSP) examples the package substrate 104 may be absent, and external connections may be made directly from one surface of a single semiconductor die incorporating the transducer and circuitry, with a lid structure mounted directly onto the other surface of the die to provide a back volume.

In general for space reasons and structural simplicity there will be a common volume communicating with both the MEMS transducer 128 and associated support circuitry 106 whether or not these are integrated on a single die or a plurality of dies, and whether or not the device comprises a separate package substrate.

In the example illustrated in FIG. 1, the package substrate 104 includes an acoustic port 114 that may comprise a sound port of a MEMS microphone. The acoustic port 114 acoustically couples to a second volume 118 on a second side of the moveable membrane 106 (which in the illustrated example is a lower or front side of the moveable membrane 106). The second volume 118 may, for example, serve as the front volume of a MEMS microphone. The fixed back plate 108 includes a plurality of holes that provide acoustic channels from a volume between the moveable membrane 106 and the fixed back plate 108 to the first volume 112. The moveable membrane 106 includes one or more bleed holes to allow low frequency pressure equalisation between the first volume 112 and the second volume 118. Alternatively, in some examples similarly narrow acoustic paths may be provided in, for example, deposited layers or the bulk of the surrounding region of the die to similarly acoustically bypass the membrane 106 at low frequencies.

In use, sound or pressure waves may enter the acoustic port 114 of the MEMS microphone device 100 and interact with the moveable membrane 106, causing the moveable membrane 106 to move in a vertical direction as shown in FIG. 1, or to tend to move in this direction. In other words, the moveable membrane 106 may experience a force in a direction towards or away from the fixed back plate 108, due to an incident sound or pressure wave. An incident sound or pressure wave, for example, may thus cause the distance between the moveable membrane 106 and the fixed back plate 108, and their associated electrodes, to change, causing a change in the capacitance between the electrodes. This change in capacitance can be detected by the support circuitry 116, which may output an electrical output signal representing the sound or pressure waves that caused the movement of the moveable membrane 106. Accordingly, the device 100 may include connections (not shown), such as metal interconnects, between the electrodes and the support circuitry 116, and connections (not shown) via e.g. bond wires or conductive tracks in or on substrate 104 from the support circuitry 116 to external terminals or solder pads for surface mounting onto, for example, a printed circuit board (PCB) of a host user device.

The support circuitry 116 is in thermal communication with the first volume 112. Thus during normal operation any variations in the power dissipation of the support circuitry 116 cause corresponding changes in the temperature of the first volume 112 which leads to corresponding changes in the pressure of the first volume 112, i.e. thermal modulation of the air pressure in the first volume 112. The first volume 112 is in acoustic communication with the moveable membrane 106 and hence changes in the air pressure of the first volume 112 cause corresponding movements of the moveable membrane 106 and hence changes in the capacitance of the capacitor formed by the moveable membrane 106 and the fixed back plate 108, which in turn cause changes in the output signal output by the support circuitry 116.

Any long term changes in the power dissipated by the support circuitry that might tend to increase or decrease the pressure in the first volume 112 would be removed by air flow though the low frequency pressure equalisation holes in, or in shunt with, the membrane 106 as mentioned above, so would not result in a long-term pressure difference.

The inventors have realised that deliberate thermal modulation of the air pressure in the first volume 112 can advantageously be used to provide a thermally generated acoustic signal with which to monitor acousto-electrical sensitivity and hence enable the detection of sensitivity drift over time in a MEMS device such as a MEMS microphone. Once sensitivity drift has been detected, steps can be taken to compensate for it. Thus, embodiments provide a system for detecting and compensating for sensitivity drift in a MEMS device such as a MEMS microphone, as will now be explained.

Figure 2B:
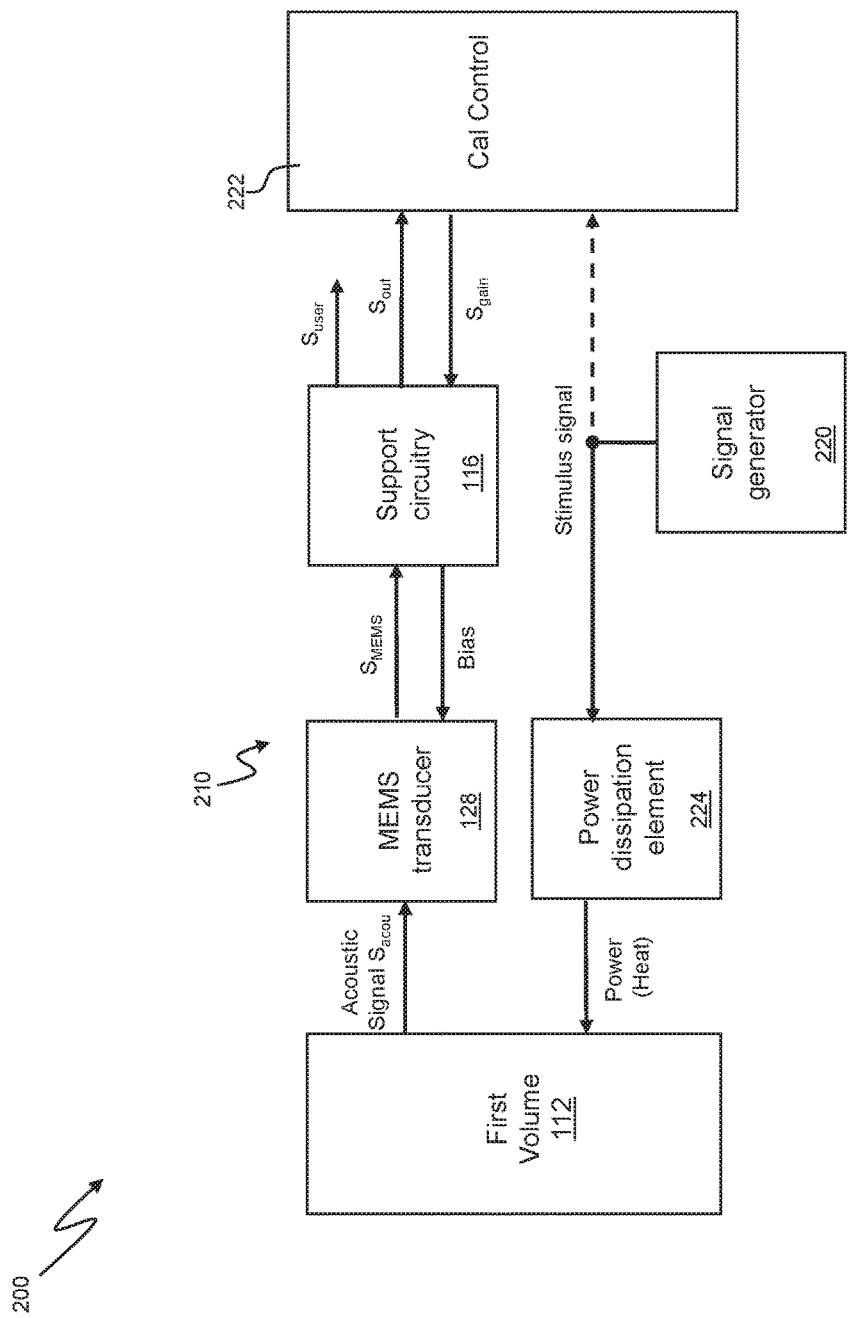
Figure 2C:
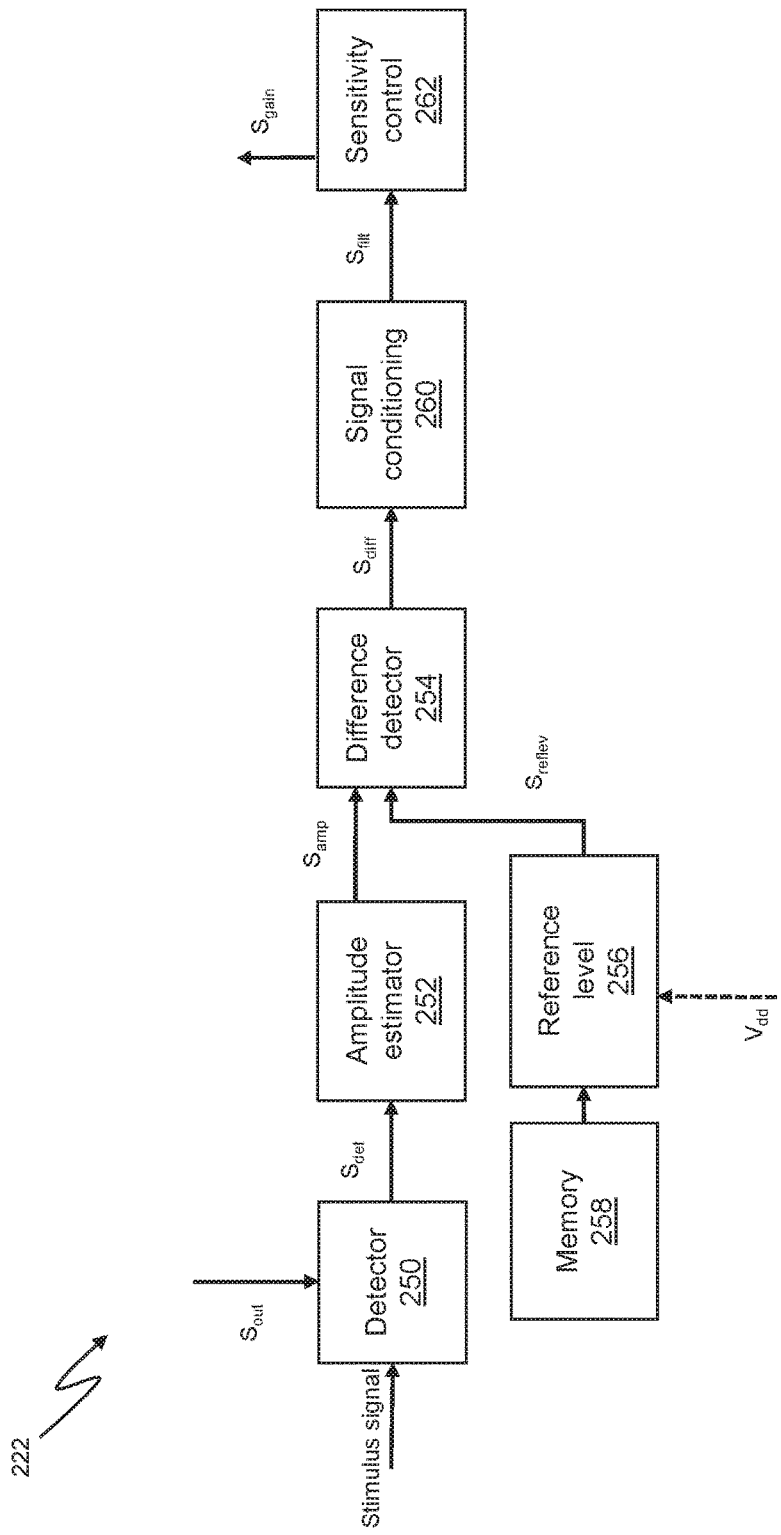
FIG. 2c is a schematic functional block diagram illustrating a sub-circuit of the system of FIG. 2b.

Referring now to FIGS. 2a, 2b and 2c, an example system for monitoring or tracking and then compensating or adjusting for sensitivity drift in a MEMS device such as a MEMS microphone is illustrated. FIG. 2a illustrates an example physical embodiment, while FIG. 2b illustrates in schematic form generally at 200 a system including a calibration control sub-circuit 222, which is illustrated in more detail in FIG. 2c.

The physical embodiment illustrated in FIG. 2a comprises a packaged MEMS device 210 similar to that described with reference to FIG. 1, and so elements that are common to the device 100 of FIG. 1 and the device 210 of FIG. 2a are denoted by common reference numerals. The MEMS device 210 comprises a package 212 comprising a lid 110 that is mechanically and/or electrically coupled to the substrate 104 within which coupling is housed a monolithic semiconductor die 102 comprising a MEMS transducer 128 comprising a moveable membrane 106 and a fixed back plate 108 and support circuitry 116. One surface of the flexible membrane 106 is in acoustic communication via channels in the fixed back plate 108 with a first volume 112 defined in part by the lid 110 and package substrate 104. The opposite surface of the flexible membrane 106 is in acoustic communication with the outside world via a second volume 118 and acoustic port 114.

In addition to these elements, the MEMS device 210 also comprises a power dissipation element 224 in thermal communication with the first volume 112. This may be co-integrated with support circuitry 116, as illustrated by element 224a, or may be disposed at least in part elsewhere within the package 212, for instance as illustrated by element 224b attached to the inner surface of the package substrate 104.

The power dissipation element 224 is electrically driven via suitable electrical connections (not shown) from signal generation circuitry 220. Calibration control circuitry 222 is also provided.

The operation of the physical elements of the MEMS device 210 of FIG. 2a is illustrated in terms of a schematic block diagram in FIG. 2b. The MEMS transducer 128 comprises a moveable membrane and a fixed back plate positioned adjacent to and spaced apart from each other, each including or forming an electrode, such that the moveable membrane and the fixed back plate form the plates of a capacitor. The MEMS transducer 128 further comprises an output terminal for outputting a transducer output signal $S_{MEMS}$, as described above. The lid 110 and substrate 104 of the package define at least in part a first volume 112 (also referred to as a back volume) within which the moveable membrane 106 of the MEMS transducer 128 is able to move in response to an incident sound or pressure wave.

The support circuitry 116 is configured to detect a change in the capacitance of the MEMS transducer 128 resulting from a sound or pressure wave that is incident on the moveable membrane of the MEMS transducer 128, and to output an output electrical signal representing the sound or pressure wave that caused the movement of the moveable membrane. To this end, the support circuitry 116 may include circuitry such as amplifier circuitry, analogue to digital converter circuitry and digital signal processing circuitry for processing the transducer output signal to generate the output electrical signal.

The power dissipation element 224 is configured to receive a generated electrical stimulus signal from the signal generator 220 and to dissipate power, in the form of heat, into the first volume 112 within the package 212 in accordance with the received stimulus electrical signal, so as to cause a change in the temperature and thus the pressure of the first volume 112 within the package 212 in accordance with the received stimulus electrical signal. Thus, the power dissipation element 224 is controlled in the sense that its heating effect can be controlled by the generated electrical stimulus signal, in contrast to the support circuitry 116, which may also have a heating effect due to the thermal power dissipation that arises during normal operation of the support circuitry 116 as a result of the current consumption, possibly varying, from a voltage supply, but which heating effect might not be controlled.

The power dissipation element 224 may comprise, for example, a passive device such as a resistor, or may comprise active circuitry. Examples are given below, described with reference to FIGS. 6a to 6e.

The power dissipation element 224 may be located in any convenient position within the package 212 that permits the power dissipation element 224 to fulfil its function of causing a change in the temperature of the first volume 112 within the package. For example, the power dissipation element 224 may be co-integrated with the support circuitry 116, for example on a semiconductor die on which the support circuitry 116 is provided, or alternatively may be provided on a semiconductor die on which the moveable membrane 106 of the MEMS transducer 128 is formed. In some embodiments, the support circuitry 116 may be provided with a covering of material (known as a "glob top") for example to provide optical shielding or environmental protection. This material also provides thermal resistance and capacitance which may provide a thermal barrier, reducing the effects of thermal modulation of the first volume 112 due to variations in the amount of heat dissipated by the support circuitry 116 that may occur during normal operation of the support circuitry 116. Other structures for thermally decoupling circuitry from a nearby volume are known. In such embodiments the power dissipation element 224 should be provided at a location that is physically spaced from the support circuitry 116 and its associated thermally insulating material, to minimise any insulating effect of the thermally insulating material on the thermal output of the power dissipation element 224.

The signal generator 220 is configured to generate a known stimulus electrical signal, which is output to the power dissipation element 224. This known stimulus electrical signal, when applied to the power dissipation element 224, causes the power dissipation element 224 to impart a corresponding thermal modulation of the air pressure in the first volume 112 within the package 212, which in turn causes an output electrical signal $S_{MEMS}$ of the MEMS transducer 128 and a derived output signal $S_{out}$, as buffered or amplified by the support circuitry 116, to be modulated with corresponding electrical signal components, due to the effect of the thermal modulation of the first volume 112 in modulating the pressure within the first volume 112 and hence causing movement of the moveable membrane of the MEMS transducer 128.

The signal generator 220 may provide the stimulus electrical signal based at least in part on some fixed internal analog or digital reference signal, for example a voltage reference or a hard-wired digital word.

The signal generator 220 may provide the stimulus electrical signal based at least in part on digital control data stored in a memory, for example read-only memory, or one-time-programmable memory, or EEPROM or a digital register that is loaded from elsewhere in a host system.

The digital control data may for example comprise information relating to the amplitude or frequency of the stimulus signal or to values of the signal over time or the length and pattern of a repeating digitally-generated sequence.

In some examples, for simplicity of design of the power dissipation element 224, the power dissipated as a result of the generated stimulus signal, and hence the resulting acoustic pressure stimulus, may be proportional to not only the applied stimulus signal, but also a supply voltage $V_{dd}$ of the power dissipation element 224. This may be the case, for example, if the power dissipation element 224 receives a current that is independent of supply, but dissipates power by current flowing from the supply to ground in one or more elements including driving current source circuitry. In such examples it may be advantageous for the amplitude of the applied stimulus signal to be adjusted to be inversely proportional to the supply voltage, to cancel out the supply dependence of the applied stimulus power. Thus the signal generator 220 may receive an indication of a supply voltage $V_{dd}$, e.g. from an ADC monitoring the supply voltage, and scale the output reference level $S_{reflev}$ accordingly. Any ripple on the supply voltage may give some contribution to the power dissipated. However resulting acoustic signals will tend to be rejected in the same way as external acoustic noise by the signal detector 250, so it is a smoothed filtered version of the supply voltage that may be monitored and reacted to.

Thus the MEMS device 200 comprises a MEMS transducer 128 in acoustic communication with a volume 112, a power dissipation element 224 in thermal communication with the volume 112 and circuitry 220 for applying a generated stimulus waveform to the power dissipation element 224. The power dissipation element provides a thermal stimulus to the volume 112 in accordance with the applied generated stimulus waveform, resulting in an acoustic stimulus to the MEMS transducer 128. This allows an electro-thermo-acoustically generated acoustic stimulus to be applied to the MEMS transducer 128, obviating the need to provide an external loudspeaker or similar and coupling the loudspeaker to the acoustic port of the device to provide such a controlled acoustic stimulus to the MEMS transducer 128. Indeed, the power dissipation element 224 may be regarded as a thermal loudspeaker or thermo-acoustic transducer.

The output signal $S_{out}$ from the support circuitry 116 is thus passed to calibration control circuitry 222 which detects the stimulus signal component thereof and serves to estimate and compensate for sensitivity drift in the MEMS device 210, by providing control information $S_{gain}$ to modify the processing of the electrical output signal in support circuitry 116, for example by adjusting an applied gain, as will be explained in more detail below.

The known stimulus electrical signal should be selected so as not to degrade the performance of the MEMS device 210 in a frequency band of interest, i.e. the frequency band of an output signal of the MEMS device that is anticipated to be used in downstream processing, within which characteristics of the MEMS transducer 128 such as sensitivity, noise and spurious signal level are defined, for example in a specification of the device. This can be achieved by generating a known stimulus electrical signal having a frequency that is outside the frequency band of interest. For example, if the MEMS device 210 is a MEMS microphone, the known stimulus electrical signal may be generated in such a way as not to contain any frequency components in, or that would degrade the performance of the MEMS microphone, in the audio frequency band (20 Hz to 20 kHz). Thus, where the MEMS device is a MEMS microphone the known stimulus electrical signal may be in a frequency band outside (for example below) the audio frequency band.

Additionally or alternatively, the known stimulus electrical signal may be generated such that its amplitude is below a noise floor of the MEMS device 210, such that any components of the known stimulus electrical signal that appear in the frequency band of interest (e.g. the audio frequency band, where the MEMS device 210 is a MEMS microphone) are masked by noise, e.g. the thermal noise of the transducer or the support circuitry in the signal path.

To minimise the risk that a genuine signal in the output electrical signal of the MEMS device 210 will be misidentified as the stimulus signal by a signal detector, the known electrical stimulus signal may be a complex signal.

To this end, the known stimulus electrical signal generated by the signal generator 220 should be a signal that is readily distinguishable in the output electrical signal of the MEMS device 210. An example of a suitable signal is a Barker code, which can readily be detected using correlation techniques.

Referring to FIG. 2c, a signal detector 250 of the calibration control unit 222 receives the output electrical signal $S_{out}$ of the MEMS device and serves to provide an output signal that is representative of components of the transducer output signal corresponding to the applied stimulus signal, but rejects other signal components that may be present, e.g. from ambient acoustic noise or voice or music signals. If the stimulus is a simple sinewave or a modulated sinewave with a carrier frequency, the signal detector 250 may take the form of a simple multiplicative mixer to down-convert to a d.c. or lower-frequency signal, or may even take the form of a suitable narrow band-pass filter. If the stimulus signal is a more complex signal, e.g. a Barker code or other direct-sequence spread spectrum waveform or similar, preferably with low off-peak autocorrelation response coefficients, the signal detector 250 may perform a matched filter or correlation function on the output electrical signal of the MEMS device 210, for example a cross correlation with a reference signal such as the stimulus signal generated by the signal generator 220, to detect the components of the stimulus signal in the output electrical signal of the MEMS device 210.

Once the stimulus signal has been recovered by the signal detector 250, the recovered stimulus signal $S_{det}$ is output to an amplitude estimator 252, which is configured to perform a time averaging function on the recovered stimulus signal to generate an indication of the average amplitude of the stimulus signal that is present in the output electrical signal of the MEMS device 210. For example the amplitude estimator 242 may comprise a peak detector that will capture the maximum amplitude of a correlator output over time with a relatively fast attack time constant and then hold it with an appropriate hold time or with a slow decay time constant.

The amplitude estimator 252 outputs the estimate $S_{amp}$ of the average amplitude of the stimulus signal that is present in the output electrical signal of the MEMS device 210 to a difference detector unit 254. The difference detector unit 254 is configured to compare the estimated average amplitude to a reference value $S_{reflev}$ provided by a reference level unit 256.

The reference level unit 256 may provide the reference value based on some fixed internal analog or digital reference signal, for example a voltage reference or a hard-wired digital word.

The reference level unit 256 may provide the reference value based on digital control data stored in a memory, for example read-only memory, or one-time-programmable memory, or EEPROM or a digital register that is loaded from elsewhere in a host system. The level of the stimulus signal applied by the signal generator 220 may also be set by the same control data, or by separately stored data.

The reference value may represent an expected or desired level of the stimulus signal component of the transducer output signal corresponding to the desired acousto-electrical sensitivity of the device.

In some examples, for simplicity of design of the power dissipation element 224, the power dissipated as a result of the generated stimulus signal, and hence the resulting acoustic pressure stimulus, may be proportional to a supply voltage $V_{dd}$ of the power dissipation element 224. This may be the case, for example, if the power dissipation element 224 receives a current that is independent of supply, but dissipates power by current flowing from the supply to ground in one or more elements including driving current source circuitry. In such examples it may be advantageous for the reference level $S_{reflev}$ also to be adjusted to be proportional to the supply voltage, to cancel out the supply dependence of the applied stimulus power. Thus the reference level unit 256 may receive an indication of a supply voltage $V_{dd}$, e.g. from an ADC monitoring the supply voltage, and scale the output reference level $S_{reflev}$ accordingly. Any ripple on the supply voltage may give some contribution to the power dissipated. However resulting acoustic signals will tend to be rejected in the same way as external acoustic noise by the signal detector 250, so it is a smoothed filtered version of the supply voltage that may be monitored and reacted to.

The output of the difference detector 254 may be further processed by a signal conditioning unit 260 which may, for example, apply some scaling, offset, smoothing or filtering to the difference signal before applying the resultant signal $S_{filt}$ to a sensitivity control unit 262.

A difference between the estimated average amplitude of the stimulus signal that is present in the output electrical signal of the MEMS device 210 and the reference value may be indicative of sensitivity drift in the MEMS transducer 128.

Based on this difference signal $S_{diff}$ as conditioned by signal conditioning unit 260 to provide conditioned signal $S_{filt}$, a sensitivity control unit 262 generates one or more analogue or digital gain correction signals that can be applied at one or more points in the support circuitry 116 to compensate for sensitivity drift in the MEMS transducer 128.

Figure 2D:
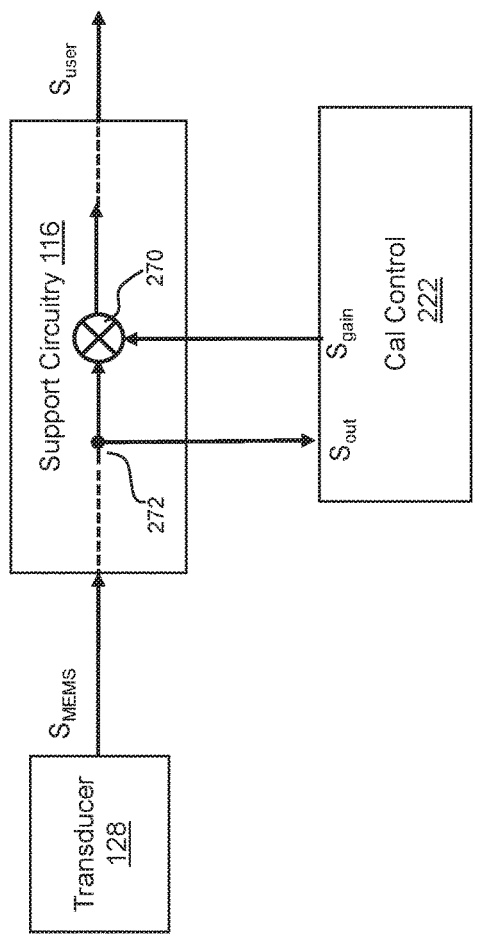
FIGS. 2d and 2e are schematic functional block diagrams illustrating operation of part of the system of FIG. 2b.
Figure 2E:
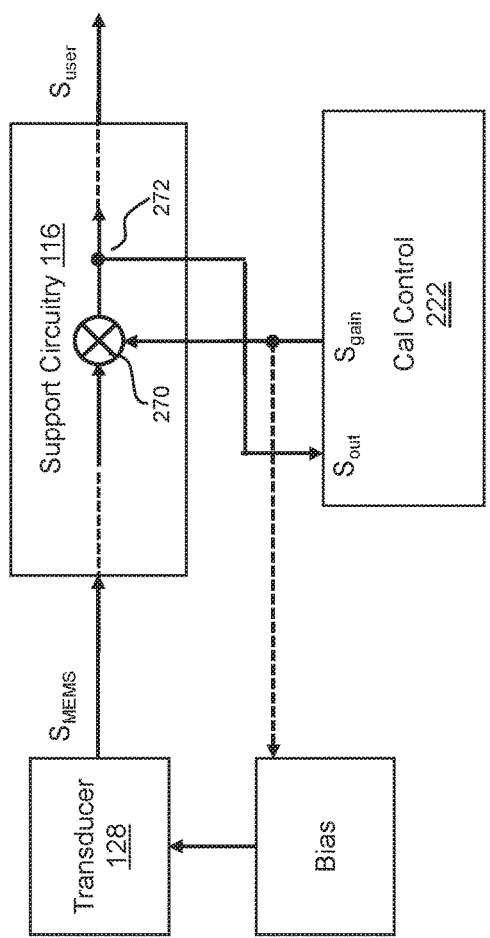

FIGS. 2d and 2e illustrate that the calibration control block 222 receives a signal $S_{out}$ derived from the MEMS transducer electrical output signal $S_{MEMS}$ by the support circuitry 116 and then supplies a suitable gain signal $S_{gain}$ to one or more gain elements in the support circuitry to provide the user with a microphone output signal $S_{user}$ which has a desired sensitivity with respect to an acoustic stimulus $S_{acou}$. The gain is controlled with respect to components of the acoustic signal that are generated thermally, but the result is that components of the acoustic signal from incoming sound signals are also processed with a controlled acousto-electric sensitivity.

A signal path extends from the transducer 128 and its electrical signal output to the output signal $S_{user}$ that is used by the user for downstream signal processing or transmission. In this signal path there is a gain element 270 which is controlled by the output of the calibration control unit 222. There is also a monitor node 272 in the signal path from which the calibration control unit 222 receives the signal derived from the MEMS transducer electrical output.

As illustrated in FIG. 2d, the gain may be applied after the monitor node 272. Signal $S_{out}$ will thus vary with variations in transducer sensitivity, and $S_{gain}$ will be generated to apply a compensating gain, the value of which will depend on the difference of the amplitude level of the relevant components of $S_{out}$ compared to some predefined reference amplitude level according to some defined function. This transfer function between amplitude level difference and compensating gain may be hard-wired or may be defined by coefficients or a look-up table (LUT) stored in some memory, for example read-only memory, or one-time-programmable memory, or EEPROM or a digital register that is loaded from elsewhere in a host system.

Alternatively, as illustrated in FIG. 2e, the gain may be arranged such that it is applied before the monitor node 272. In such an arrangement, the calibration control unit 222 may be designed to control the gain by negative feedback so as to render the amplitude of $S_{out}$ close to the desired level. Any small deviation in the amplitude of $S_{out}$ will result in a relatively large change in the applied gain. To provide stability for the negative feedback loop the signal path from $S_{out}$ to $S_{gain}$ within the calibration control unit 222 will require some filtering to restrict the control bandwidth. Some filtering may be provided by the acoustic capacitance of the first volume 112, but some filtering and also at least some of the loop gain may be provided by the signal conditioning unit 260.

In other examples the calibration control unit 222 may adjust gain both before and after the monitor mode 272.

Figure 3A:
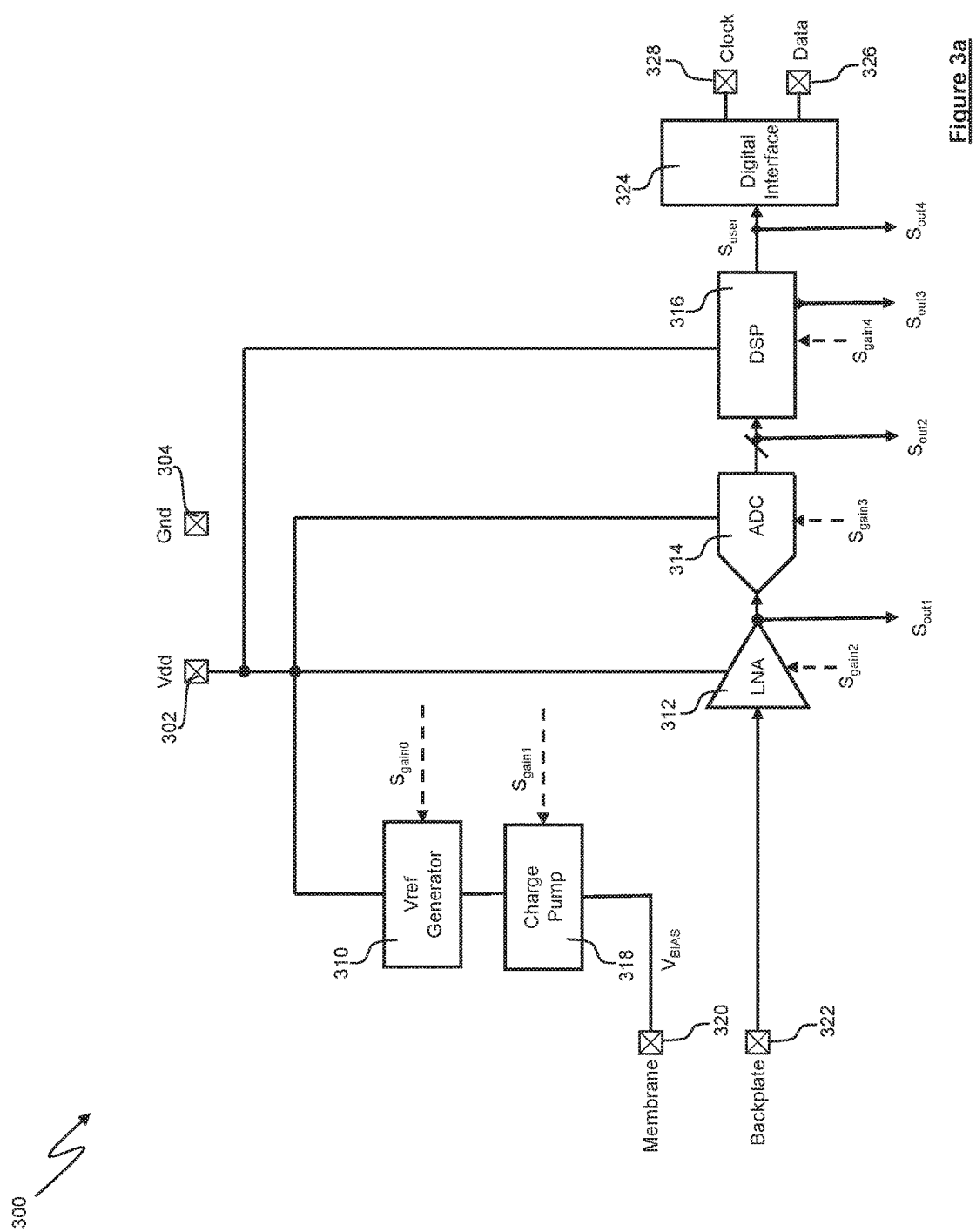

FIG. 3a is a schematic block diagram illustrating functional elements that may be present in the support circuitry 116 of the MEMS device 210. It is to be understood that the schematic block diagram of FIG. 3a does not necessarily show every functional element that may be present in the support circuitry, as some elements that are not relevant to the present disclosure have been omitted for reasons of clarity and brevity.

The support circuitry, shown generally at 300 in FIG. 3a, includes power supply input terminals or nodes 302, 304 configured for connection to a power supply voltage $V_{dd}$ and to ground respectively.

A reference generator 310 is configured to generate a reference voltage Vref that is substantially immune to any variations that might exist in the supply voltage $V_{dd}$. The reference generator 310 outputs the reference voltage Vref to a charge pump 318, which is configured to generate a bias voltage $V_{BIAS}$, which is output, via a membrane output terminal or node 320, to the moveable membrane 106 of the MEMS transducer 128 to bias the moveable membrane 106.

The support circuitry 300 further includes a backplate input terminal or node 322 which is configured to be connected to the fixed backplate of the MEMS transducer 128. The output voltage signal generated by the MEMS transducer 128 is input, via the backplate input terminal 322, to an LNA 312, which is configured to amplify the output voltage signal. An output of the LNA 312 is connected to an input of an ADC 314, which is configured to convert the analogue signal output by the LNA 312 into a digital output signal, which may be, for example, a 4-bit oversampled digital output signal.

The digital signal output by the ADC 314 is received at an input of a DSP unit 316. The DSP unit 316 is configured to perform digital signal processing such as digital filtering on the digital signal output by the ADC 314 and to output a processed digital signal $S_{user}$ representing the sound or pressure waves that caused the movement of the moveable membrane of the MEMS transducer 128 for use by a user in downstream signal processing or transmission. The signal $S_{user}$ may be retimed or reformatted by digital interface 324. The digital interface 324 has digital data and clock outputs which are coupled to data and clock output terminals or nodes 326, 328 of the support circuitry 300, which are configured to be coupled to components or circuitry external to the support circuitry 300.

As discussed above, one or more gain correction signals can be applied at one or more points in the support circuitry 300 to compensate for sensitivity drift in the MEMS transducer 128.

For example, a gain correction signal $S_{gain0}$ output by the calibration control unit 222 might be input to the reference generator 310, to adjust the reference voltage that is input to the charge pump 318, thereby adjusting the bias voltage $V_{BIAS}$ that is applied to the moveable membrane 106 of the transducer 128 and hence the electric field between the transducer electrodes. Since the output signal voltage of the transducer 128 is directly proportional to the electric field between the electrodes, an appropriate adjustment to the reference voltage that is input to the charge pump 310 can be used to adjust the output signal voltage of the transducer 128 to compensate for any detected change in the sensitivity of the transducer 128.

Alternatively (or additionally), a gain correction signal $S_{gain1}$ output by the calibration control unit 222 might be input to charge pump 318, e.g. to control the number of stages or the step-up ratio of one or more stages, to adjust the voltage $V_{BIAS}$ applied across the capacitive transducer. This will alter the effective electrical sensitivity of the transducer 128.

Alternatively (or additionally), a gain correction signal $S_{gain2}$ output by the calibration control unit 222 might be input to the LNA 312, to adjust the gain of the LNA 312 to compensate for any detected change in the sensitivity of the transducer 128.

Alternatively (or additionally), a gain correction signal $S_{gain3}$ output by the calibration control unit 222 might be input to the ADC 314, e.g. to control full-scale reference voltages, to adjust the conversion gain of the ADC 314 to compensate for any detected change in the sensitivity of the transducer 128.

Alternatively (or additionally), a gain correction signal $S_{gain4}$ output by the calibration control unit 222 might be input to the DSP 316, to adjust the output of the DSP 316 (for example by adjusting coefficients of a digital filter implemented by the DSP 316, or by applying a simple multiplier function) to compensate for any detected change in the sensitivity of the transducer 128.

As discussed with respect to FIGS. 2d and 2e, the calibration control unit 222 may monitor a signal at a monitor node that may be at various points in the signal path between the transducer 128 and the user-visible output signal $S_{user}$. In the example illustrated in figure of FIG. 3a this single may thus be $S_{out1}$ at the output of LNA 312, the raw digital output $S_{out2}$ from ADC 314, the output $S_{out3}$ of the DSP 316 or a signal $S_{out4}$ from some intermediate node in DSP 316.

Figure 3B:
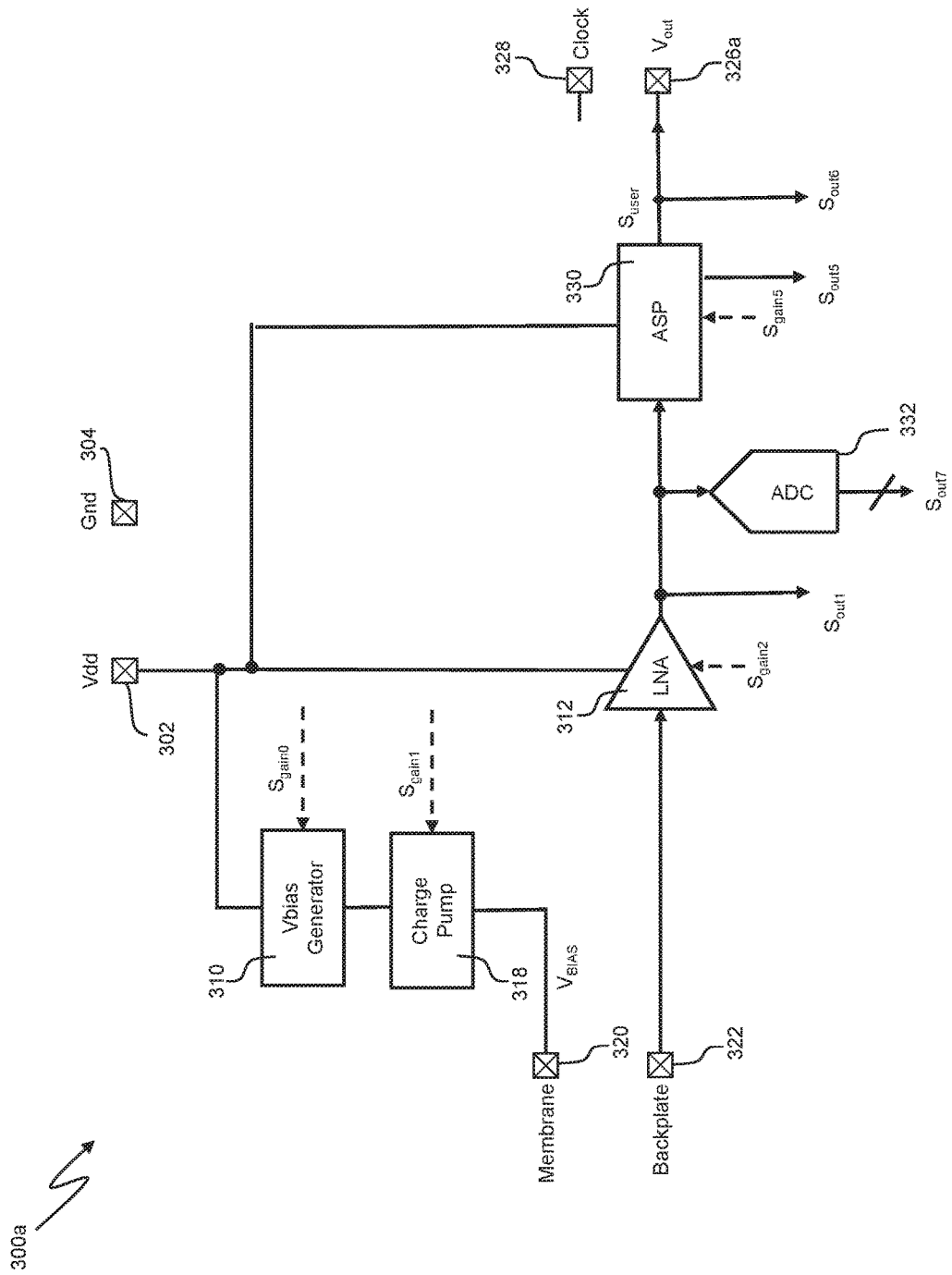
Figure 3B:
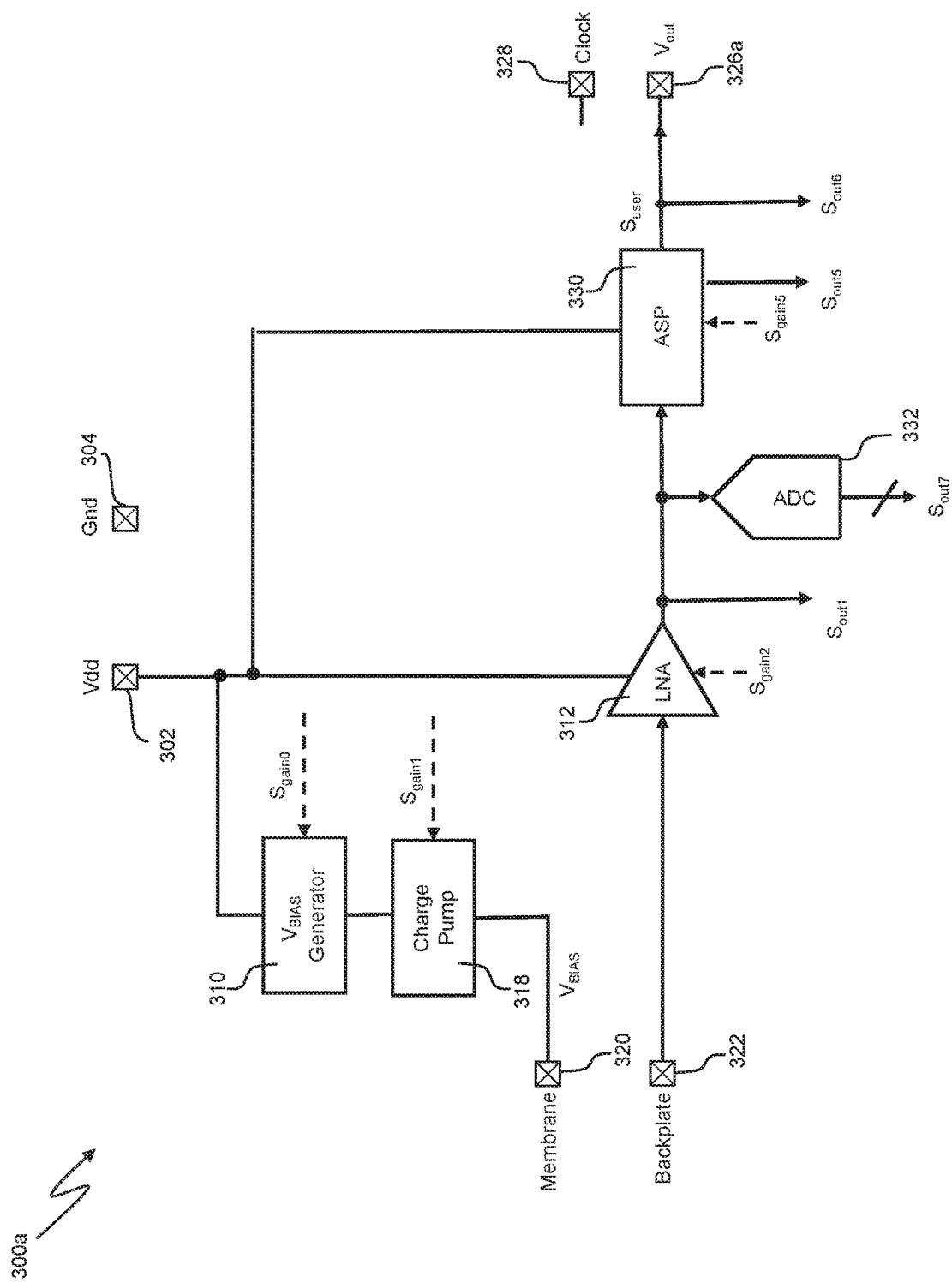

FIG. 3b is a schematic block diagram illustrating functional elements that may be present in the support circuitry 116 of another example MEMS device 210, in this case one which provides an analog rather than digital signal to the user. The support circuitry, shown generally at 300a in FIG. 3, provides the analog output for the user. Circuitry 300a comprises many elements similar to numbered elements of FIG. 3a. However, in this example instead of passing through an ADC 314 and a DSP 316, as in the example illustrated in FIG. 3a, the output signal from LNA 312 to the user output may pass instead via analog signal processing circuitry 330. The monitor signal $S_{out}$ to the calibration control unit 222 may be an analog signal from one or more of various points in the path from transducer 128 to user output, as illustrated by $S_{out1}$, $S_{out5}$, and $S_{out6}$. In some examples an analog signal from a point in this signal path may pass through an ADC 332 to provide a monitor output for the calibration control unit 222 as illustrated by $S_{out7}$. This ADC 332 may be relatively simple, compared to a signal path ADC such as the ADC 314 of FIG. 3a, as it may only be required for this test purpose rather than requiring full performance and dynamic range.

Figure 4A:
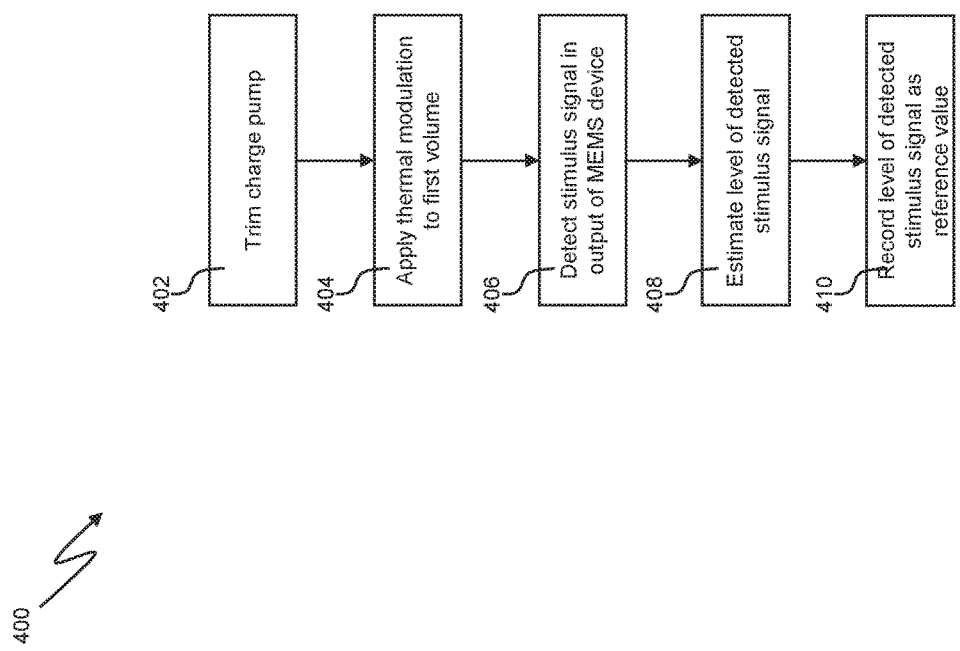
FIG. 4a is a flow diagram illustrating steps performed in a calibration process for a MEMS device.

To compensate for manufacturing variations in the performance of individual components or elements of the MEMS device 210, a trimming or calibration process may be performed during following manufacture of the MEMS device 210, as will now be described with reference to FIG. 4a.

During an initial production test that is performed as part of a production process of the MEMS device, a controlled acoustic stimulus is applied to the transducer and the microphone device output monitored, and an acousto-electric sensitivity is deduced. The sensitivity is the adjusted to the required nominal value by trimming the bias generator 310 or charge pump 318, or by setting and storing values for gain at other gain adjustment points in the circuitry as described with respect to FIG. 3 (step 402 of the process 400 of FIG. 4a).

Following this initial trimming of the sensitivity, at step 404 a thermal modulation is applied to the first volume 112 of the MEMS device 210 by applying a known electrical stimulus signal to the power dissipation element 224 as described above, to generate a corresponding stimulus signal in the electrical signal output by the MEMS transducer 116.

At step 406, the stimulus signal in the electrical signal output by the MEMS transducer 116 is detected by the signal detector 250 as described above.

At step 408, the average amplitude of the detected stimulus signal is estimated by the amplitude estimator 252 as described above.

As step 410 the estimated average amplitude of the detected stimulus signal is recorded in memory 258, for example in a one-time programmable (OTP) element, of the MEMS device 200.

Thus, during the initial production test process a reference value for the estimated average amplitude of the detected stimulus signal is generated and is recorded in the memory 258 of the MEMS device.

Figure 4B:
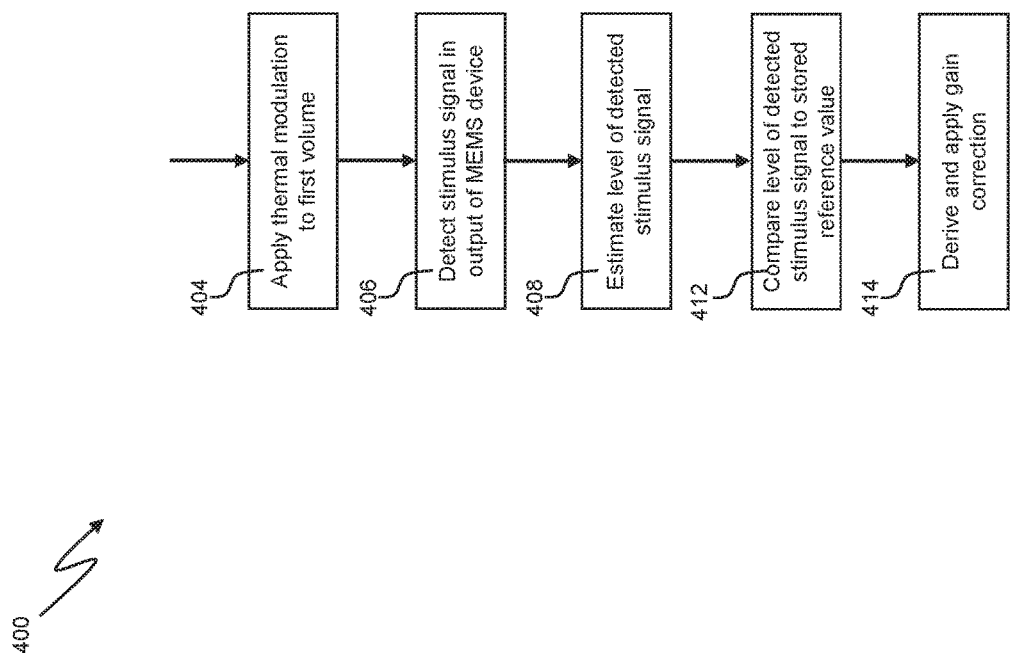
FIG. 4b is a flow diagram illustrating steps performed in an alternative calibration or recalibration process for a MEMS device.

In principle, the sensitivity trimming step 402 could be performed periodically to detect and compensate for subsequent drift or variations in the performance of a particular MEMS device 210. However in use in a user's mobile device, for example, a suitable controlled acoustic stimulus is unlikely to be available. Thus, instead a thermally generated acoustic stimulus may be used instead to allow a drift calibration and correction process to be performed during start-up or periodically during use or continuously in operation of the MEMS device 210, as will now be described with reference to FIG. 4b.

Thus, during a subsequent start-up procedure, and/or periodically during operation of the MEMs device, steps 404, 406 and 408 may be performed, so as to generate and detect a stimulus signal in the electrical output signal of the transducer of the MEMS device 200.

Following the estimation of the average amplitude of the detected stimulus signal by the amplitude estimator 252 at step 408, the estimated average amplitude of the detected stimulus signal is compared, at step 412, to the reference value recorded in the memory 258 (which, as discussed above, may be a reference value based on an estimate of the average value of the detected stimulus signal that was determined prior to performing the start-up or periodic drift calibration and correction process). Based on this difference, a gain correction may be calculated and applied, to compensate for this sensitivity drift.

In some variants of the method, especially where the procedure is applied only periodically as a check of operation or on start-up, if there is no difference between the estimated average amplitude of the detected stimulus signal and the reference value recorded in the memory 258 (or if the difference is smaller than some threshold value representing an acceptable level of sensitivity drift), then no action is required to compensate for sensitivity drift in the transducer 128. However, a difference between the estimated average amplitude of the detected stimulus signal and the reference value recorded in the memory 258 (or a difference that meets or exceeds the threshold) may be indicative of an unacceptable amount of sensitivity drift in the transducer 128 of the MEMS device 200. In this case, gain correction can be applied by the calibration control unit 222 as described above, to compensate for this sensitivity drift.

As described above, MEMS transducer 128 and the support circuitry 116 of the MEMS device 210 may be provided on a single common semiconductor die within the package 212. Alternatively, the MEMS transducer 128 and the support circuitry 116 of the MEMS device 210 may be provided on separate semiconductor dies within the package 212.

FIGS. 5a, 5b, 5c, and 5d illustrate various alternative physical embodiments of a MEMS device 210. Elements similar to those illustrated in FIG. 2a are denoted by the same respective numeric labels.

Figure 5A:
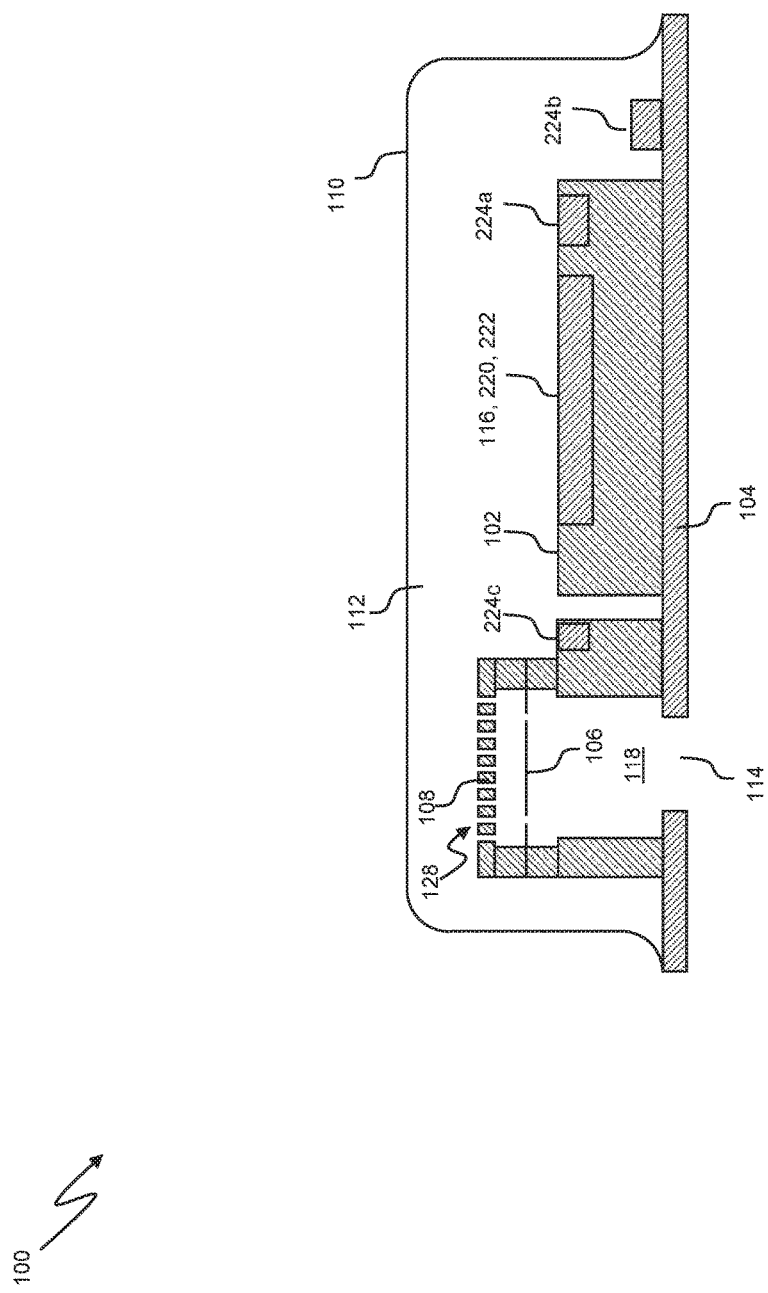
FIG. 5a is a schematic cross-sectional representation of an alternative MEMS device.

FIG. 5a illustrates a packaged MEMS device similar to that of FIG. 2a, but where the MEMS transducer 128 and the support circuitry 116 of the MEMS device 210 may be provided on separate monolithic semiconductor dies within the package. The power dissipation element 224 may be provided on the same monolithic die as the circuitry 116 (224a), attached to the package substrate 104 (224b), or on the same monolithic die as the MEMS transducer 128 (224c).

Figure 5B:
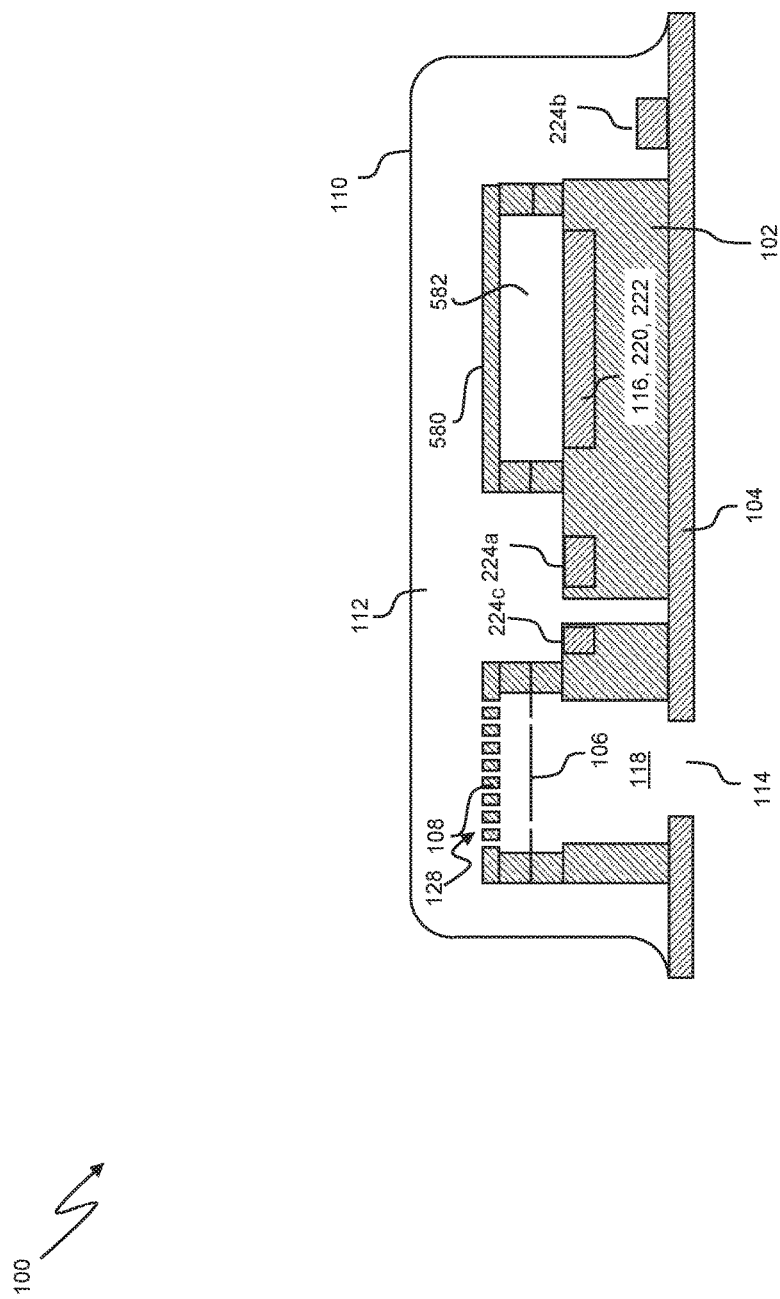
FIG. 5b is a schematic cross-sectional representation of a further alternative MEMS device.

FIG. 5b illustrates a package similar to that of FIG. 5b, but wherein circuit die 102 is at least partially covered by a structure comprising sidewalls and a cover 580 which enclose a volume 582 to provide a structure which provides a thermal barrier between circuitry and the first volume 112. In this case the power dissipation element 224a may be placed on circuit die 102, but not covered by the thermal barrier structure. Advantageously, some of the circuitry controlling current into power dissipation element 224a, for instance the signal generator 220, may be positioned under the thermal barrier structure, to avoid thermal communication of any variation with supply voltage of the thermal dissipation of this circuitry.

Figure 5C:
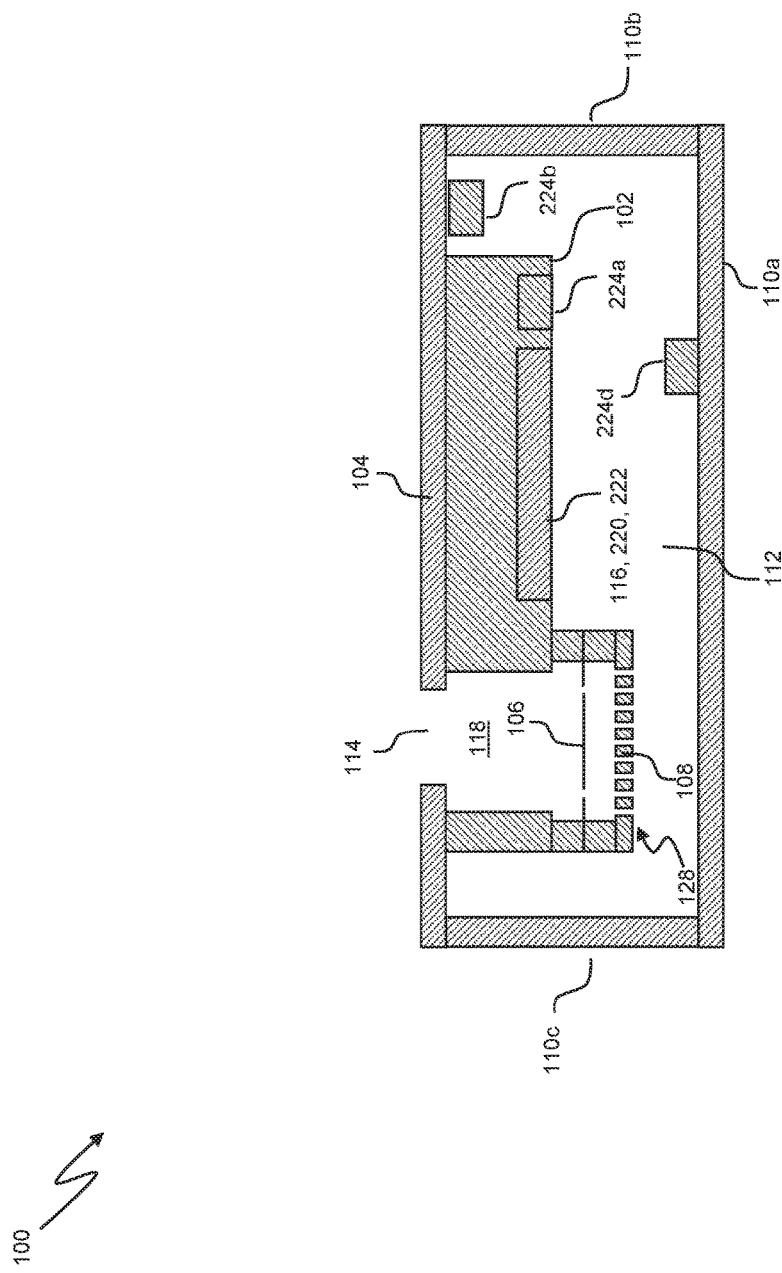
FIG. 5c is a schematic cross-sectional representation of a further alternative MEMS device.

FIG. 5c illustrates a package containing an integrated transducer 128 similar to that of FIG. 2a, but where the lid comprises a cover portion 110a and sidewalls 110b, 110c. Such a lid 110 may be constructed, for example, out of laminate material such as common printed circuit board (PCB) material for example. A PCB based laminate lid 110 used in conjunction with a laminate, for example PCB, based substrate 104 has the advantage that necessary electrical pathways to and from the MEMS transducer 128, support circuitry 116, power dissipation element 224 and input/output terminals, bond pads external solder pads, i.e. second level interconnections, on the cover portion 110a and/or the substrate 104 may be routed via the PCB laminate material as is known and understood in the art. Such a three-piece laminate package allows a MEMS device with an acoustic port that may be situated on the opposite external surface of the package than the solder pads, which may be desirable in some applications.

FIG. 5d illustrates a package wherein there might not be any package substrate 104, and wherein the lid is mounted directly on an integrated transducer die 102 (possibly via common layers of the transducer as illustrated). The lid may be provided as a second silicon die 110 with a cavity comprising the first volume 112. External electrical connections may be made by through-silicon vias (TSV) through die 102 to solder pads on the upper surface of the package, i.e. the same external surface as acoustic port 114, or via TSVs through the sidewalls of lid 110 to solder pads on the lower surface of the package, i.e. the opposite external surface to acoustic port 114.

As a further alternative, the MEMS transducer 128 and the power dissipation element 224 may be provided within the package 212 and the calibration control circuitry 222 may be provided outside the package 212, for instance provided at least in part as part of some companion circuitry, e.g. an audio codec or DSP circuit, in a host device. In such an arrangement the power dissipation element 224 may be provided on a semiconductor die on which the MEMS transducer 128 is provided, or may be provided elsewhere in the package 212.

In the examples illustrated, the backplate 108 has been described as being interposed between the flexible membrane 106 and the first volume 112. In some examples the relative position of membrane and backplate may be reversed, so that the flexible membrane 106 is interposed between the backplate 108 and the first volume 112. In the examples above, a bias voltage was applied to the flexible membrane 106 and the MEMS electrical signal $S_{MEMS}$ taken from the backplate 108. In other examples, a bias voltage may be applied to the backplate 108 and the MEMS electrical signal $S_{MEMS}$ taken from the flexible membrane 106.

FIGS. 6a, 6b, 6c, 6d and 6e illustrate example embodiments of circuitry comprising a power dissipation element 224.

Figure 6A:
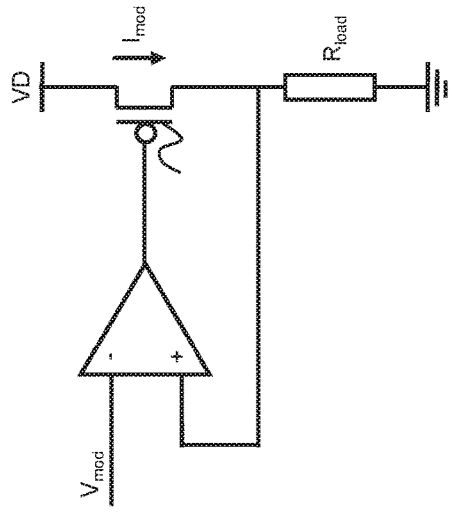
FIGS. 6a-6e illustrate example embodiments of circuitry comprising a power dissipation element.

FIG. 6a illustrates a current-output digital-to-analog converter (IDAC) which receives a digital waveform $D_{mod}$ and outputs a corresponding output current Idd, which modulated current flows between a supply or buffered reference voltage VD and ground. The DAC dissipates a power $I_{mod}*V_{dd}$. The current DAC may be a known construction, for example a set of parallel switchable matched current sources.

Figure 6B:
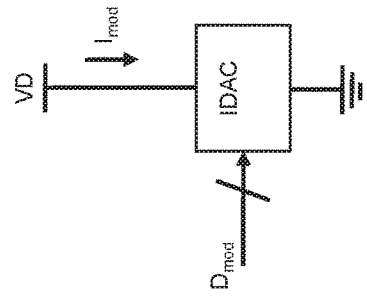

FIG. 6b illustrates a circuit in which an input analog voltage $V_{mod}$ (which may be derived in a preceding digitalto-analog converter) producing a current $V_{mod}/R_{load}$ which flows from $V_{dd}$ to ground, giving a power dissipation modulation of $V_{mod}*VD/R_{load}$. In some embodiments the heating element 224 may comprise only the resistor Road.

Figure 6C:
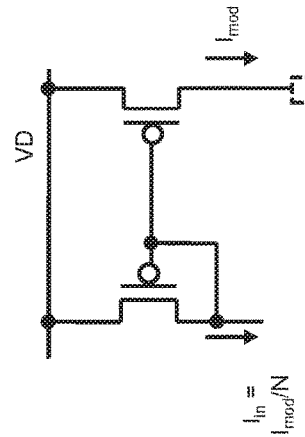

FIG. 6c illustrates a circuit in which an input sink current $I_{in}$ (which may be derived in an IDAC) is mirrored through a PMOS current mirror of ratio N to provide a larger current $I_{mod}$ that flows from a supply or reference voltage VD to ground. Some of the power may be dissipated in a resistor $R_{load}$, which in some examples may comprise power dissipation element. In other examples the resistor may be absent, and transistor P2 comprises the power dissipation element.

Figure 6D:
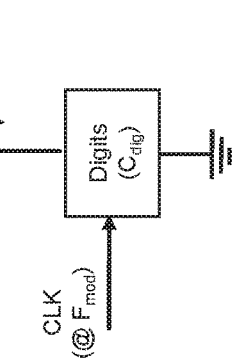

FIG. 6d illustrates a circuit in which a capacitance $C_{mod}$ is repetitively charged to a voltage VD and discharged to ground at a frequency $F_{mod}$, to give a power dissipation in the switches of $C_{mod}.F_{mod}.VD^2$. Either $F_{mod}$ or $C_{mod}$ may be modulated to modulate the power dissipation.

Figure 6E:
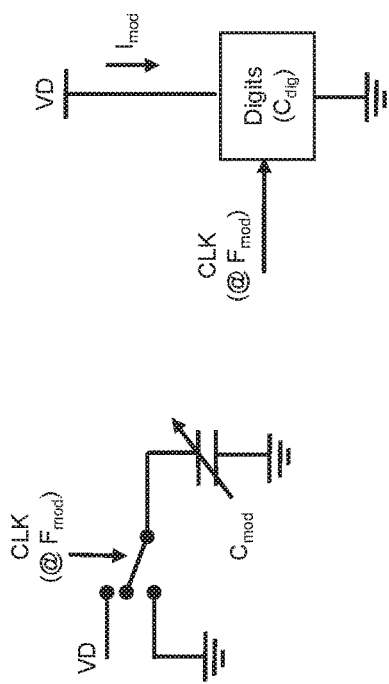

In a similar fashion, FIG. 6e illustrates a circuit where many gates of digital circuitry are clocked a frequency $F_{mod}$, to give a power dissipation in the digital gates switches of $C_{tot}.F_{mod}.VD^2$, where $C_{tot}$ is the total effective gate capacitance charged and discharged each cycle. Either $F_{mod}$ or $C_{tot}$ may be modulated to modulate the power dissipation.

As will be appreciated, the system and method described above provide a mechanism for detecting and compensating for sensitivity drift in a MEMS device such as a MEMS microphone.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a gaming device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A micro electro-mechanical system (MEMS) device comprising:
   a fixed electrode;
   a moveable electrode that is moveable with respect to the fixed electrode;
   an output terminal for outputting a transducer output signal indicative of a capacitance between the fixed electrode and the moveable electrode;
   a package housing the fixed electrode and the moveable electrode, wherein the package defines a first volume on a first side of the moveable electrode, and wherein the moveable electrode is moveable within the first volume in response to sound or pressure waves incident on the moveable electrode; and
   a power dissipation element disposed within the package, wherein the power dissipation element is configured to receive a generated stimulus signal and to dissipate heat into the first volume so as to modulate the pressure of air within the first volume in accordance with the received generated stimulus signal.

2. A MEMS device according to claim 1 wherein the MEMS device further comprises signal generator circuitry configured to output the generated stimulus signal to the power dissipation element, wherein the signal generator circuitry is configured to generate the generated stimulus signal based at least in part on stored digital control data.

3. A MEMS device according to claim 2 wherein the signal generator circuitry comprises a system for adjusting the generated stimulus signal in accordance with changes to a supply voltage of the MEMS device.

4. A MEMS device according to claim 3 wherein the signal generator circuitry is configured to monitor the supply voltage and to modulate the generated stimulus signal in inverse proportion to a magnitude of the supply voltage.

5. A MEMS device according to claim 1 wherein the MEMS device further comprises:
   support circuitry configured to provide a bias voltage to the moveable membrane or to process the transducer output signal.

6. A MEMS device according to claim 5, wherein the MEMS device further comprises:
   detection circuitry configured to detect a stimulus signal in the transducer output signal that corresponds to the generated stimulus;
   amplitude estimator circuitry configured to estimate an amplitude of the detected stimulus signal; and
   gain correction circuitry configured to apply a gain correction to the support circuitry based on the estimated amplitude.

7. A MEMS device according to claim 5 wherein the support circuitry comprises at least one of:
   reference generator circuitry configured to generate a reference voltage for a charge pump that is configured to provide the bias voltage to the moveable membrane;

amplifier circuitry configured to amplify the transducer output signal; and signal processing circuitry, wherein the gain correction circuitry is configured to apply a gain correction to at least one of the reference generator circuitry, amplifier circuitry and signal processing circuitry.

8. A MEMS device according to claim 5, wherein:

the moveable electrode is integrated on a first semiconductor die;

the support circuitry is integrated on a second semiconductor die; and the power dissipation element is integrated on the first semiconductor die or the second semiconductor die.

9. A MEMS device according to claim 8, wherein the power dissipation element is provided within the package but is not integrated on the first or second semiconductor die.

10. A MEMS device according to claim 5, wherein at least part of the support circuitry is covered with a thermal barrier, and wherein the power dissipation element is physically spaced from the support circuitry and the thermal barrier.

11. A MEMS device according to claim 1 wherein the generated stimulus signal comprises a complex signal.

12. A MEMS device according to claim 11 wherein the generated stimulus signal comprises a direct-sequence spread-spectrum code.

13. A MEMS device according to claim 1 wherein a frequency of the generated stimulus signal is outside a frequency band of interest of the MEMS device.

14. A MEMS device according to claim 1 wherein an amplitude of the generated stimulus signal is lower than a noise floor of the MEMS device.

15. A MEMS device according to claim 1 wherein the power dissipation element comprises a passive device or active circuitry.

16. A MEMS device according to claim 1 wherein the moveable electrode is integrated on a first semiconductor die.

17. An electronic apparatus comprising a MEMS device according to claim 1, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

18. An electronic apparatus comprising a MEMS device according to claim 17, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

19. A method for compensating for a change in the sensitivity of a transducer of a MEMS device, wherein the transducer comprises:

a fixed electrode;

a moveable electrode that is moveable with respect to the fixed electrode; and an output terminal for outputting a transducer output signal indicative of a capacitance between the fixed electrode and the moveable electrode, wherein the MEMS device comprises:

a package housing the fixed electrode and the moveable electrode, wherein the package defines a first volume on a first side of the moveable electrode, and wherein the moveable electrode is moveable within the first volume in response to sound or pressure waves incident on the moveable electrode; and support circuitry configured to provide a bias voltage to the moveable membrane or to process the transducer output signal, wherein the method comprises:

modulating the pressure of air in the first volume in accordance with a generated stimulus signal to generate a corresponding output stimulus signal in the transducer output signal;

detecting the output stimulus signal;

estimating an amplitude of the detected stimulus signal; and applying a gain correction to the support circuitry based on the estimated amplitude in order to compensate for sensitivity drift in the transducer.

20. A micro electro-mechanical system (MEMS) device for providing an electrical output signal in response to an input acoustic signal, the device comprising: a capacitive MEMS transducer in acoustic communication with a volume a power dissipation element in thermal communication with the volume; a stimulus signal generator for driving the power dissipation element with a generated stimulus signal; calibration control circuitry for comparing a level of a component of an electrical signal derived from the transducer and related to the stimulus signal to a stored reference level; and gain control circuitry configured to adjust the amplitude of the electrical output signal in response to the comparison.

* * * * *

UNITED STATES PATENT AND TRADEMARK OFFICE
CERTIFICATE OF CORRECTION

Page 1 of 2

PATENT NO. : 10,244,331 B1
APPLICATION NO. : 15/953094
DATED : March 26, 2019
INVENTOR(S) : James Thomas Deas and John Paul Lesso It is certified that error appears in the above-identified patent and that said Letters Patent is hereby corrected as shown below:

In the Drawings

Replace Drawing Sheet 7 of 14 with the attached Replacement Sheet 7 of 14, in which the following amendment is made:
In Fig. 3b, Drawing Sheet 7 of 14, for Tag "310", in Line 1, delete "Vbias" and insert -- $V_{BIAS}$ --, therefor.

In the Specification

Column 6, Line 6, delete "volume a" and insert -- volume; a --, therefor.

Column 8, Line 57, delete "flow though" and insert -- flow through --, therefor.

Column 11, Line 30, delete "MEMS device 200" and insert -- MEMS device 210 --, therefor.

Column 15, Line 31, delete "charge pump 310" and insert -- charge pump 318 --, therefor.

Column 16, Line 55, delete "MEMS device 200." and insert -- MEMS device 210. --, therefor.

Column 17, Line 8, delete "MEMS device 200." and insert -- MEMS device 210. --, therefor.

Column 17, Line 35, delete "MEMS device 200." and insert -- MEMS device 210. --, therefor.

Column 17, Line 58, delete "of FIG. 5b," and insert -- of FIG. 5a, --, therefor.

Column 19, Line 4, delete "Road." and insert -- $R_{load}$. --, therefor.

Signed and Sealed this
Fifth Day of November, 2019

Andrei Iancu
*Director of the United States Patent and Trademark Office*

UNITED STATES PATENT AND TRADEMARK OFFICE
CERTIFICATE OF CORRECTION

PATENT NO. : 10,244,331 B1
APPLICATION NO. : 15/953094
DATED : March 26, 2019
INVENTOR(S) : James Thomas Deas and John Paul Lesso It is certified that error appears in the above-identified patent and that said Letters Patent is hereby corrected as shown below:

In the Claims

Please amend Claim 20 as follows:
20. A micro electro-mechanical system (MEMS) device for providing an electrical output signal in response to an input acoustic signal, the device comprising:
a capacitive MEMS transducer in acoustic communication with a volume;
a power dissipation element in thermal communication with the volume;
a stimulus signal generator for driving the power dissipation element with a generated stimulus signal;
calibration control circuitry for comparing a level of a component of an electrical signal derived from the transducer and related to the stimulus signal to a stored reference level; and
gain control circuitry configured to adjust the amplitude of the electrical output signal in response to the comparison.

Signed and Sealed this
Seventeenth Day of March, 2020

Andrei Iancu
*Director of the United States Patent and Trademark Office*